US012701676B2

(12) United States Patent
Zeng

(10) Patent No.: US 12,701,676 B2
(45) Date of Patent: Aug. 4, 2026

(54) THERMAL CONDUCTIVE ELEMENT AND ELECTRONIC DEVICE

(71) Applicant: Lenovo (Beijing) Limited, Beijing (CN)

(72) Inventor: Cong Zeng, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 198 days.

(21) Appl. No.: 18/435,111

(22) Filed: Feb. 7, 2024

(65) Prior Publication Data

US 2024/0314981 A1    Sep. 19, 2024

(30) Foreign Application Priority Data

Mar. 13, 2023    (CN) .......................... 202310235761.4

(51) Int. Cl.
    *H05K 7/20*        (2006.01)
    *G06F 1/16*        (2006.01)
(52) U.S. Cl.
    CPC ....... *H05K 7/20472* (2013.01); *G06F 1/1616* (2013.01); *G06F 1/1652* (2013.01); *G06F 1/1681* (2013.01)

(58) Field of Classification Search
    CPC . H05K 7/20472; G06F 1/1616; G06F 1/1652; G06F 1/1681
    See application file for complete search history.

(56) References Cited

U.S. PATENT DOCUMENTS

2021/0373628 A1* 12/2021 Lin ........................ G06F 1/1683
2022/0338380 A1* 10/2022 Han .................... H05K 7/20963
2023/0409077 A1* 12/2023 Kim .................... H04M 1/0268

OTHER PUBLICATIONS

Chen, Heat dissipation film and foldable display equipment, Jan. 28, 2022 (Year: 2022).*
Zhang et al., CN113436538, Display Module and Display Device, Sep. 24, 2021, PE2E Translation (Year: 2021).*

* cited by examiner

*Primary Examiner* — Michael A Matey
(74) *Attorney, Agent, or Firm* — ANOVA LAW GROUP, PLLC

(57)        ABSTRACT

A thermal conductive element includes a thermal conductive sheet and a target piece. The target piece is configured to be disposed in a target area of the thermal conductive sheet, and the target piece makes a target part of the thermal conductive sheet deform to form a first protrusion.

16 Claims, 5 Drawing Sheets

111/112

11

111/112

11

12

1

THERMAL CONDUCTIVE ELEMENT AND ELECTRONIC DEVICE

CROSS-REFERENCE TO RELATED APPLICATION

This application claims priority to Chinese Patent Application No. 202310235761.4, filed on Mar. 13, 2023, the content of which is incorporated herein by reference in its entirety.

TECHNICAL FIELD

The present disclosure generally relates to the field of electronic device technology and, more particularly, to a thermal conductive element and electronic device.

BACKGROUND

With the continuous development of science and technology, more and more electronic devices are widely used in people's daily life and work, bringing great convenience to people's daily life and work, and becoming an indispensable and important tool for people these days.

In order to meet people's growing needs, electronic devices integrate more and more electronic components so that the electronic devices may integrate more functions. Electronic components require lower operating temperatures to ensure their safe and reliable operation. However, electronic components will generate heat during operation. In order to ensure that electronic components work within a predefined temperature range, an electronic device requires an effective heat dissipation design.

SUMMARY

In accordance with the present disclosure, there is provided a thermal conductive element. The thermal conductive element includes a thermal conductive sheet and a target piece. The target piece is configured to be disposed in a target area of the thermal conductive sheet, and the target piece makes a target part of the thermal conductive sheet deform to form a first protrusion.

Also in accordance with the present disclosure, there is provided an electronic device. The electronic device includes a first device body, a second device body, and a hinge-connection element located between the first device body and the second device body. When the first body and the second body connected through the hinge-connection element are in an unfolded state, a deformed portion of a thermal conductive element of the electronic device forms at least one first protrusion. When the first body and the second body connected through the hinge-connection element are in a folded state, the deformed portion of the thermal conductive element forms a second protrusion.

BRIEF DESCRIPTION OF THE DRAWINGS

In order to more clearly explain the technical solutions in the embodiments of the present disclosure or related technologies, the drawings consistent with the description of the embodiments will be briefly described hereinafter. Apparently, the drawings in the following description are merely for the embodiments of the present disclosure, those of ordinary skill in the art may also derive other drawings based on the provided drawings without exerting creative efforts.

2

Figure 1:
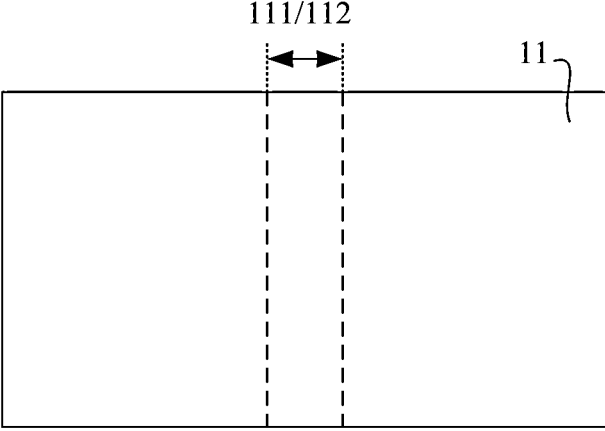

The structures, proportions, sizes, etc., shown in the drawings of this specification are merely used to coordinate with the content disclosed in the specification and are for people familiar with this technology to understand and read, but are not meant to limit the conditions for the implementation of the present disclosure. Any structural modifications, changes in proportions, or size adjustments shall still fall within the scope and content of the technology disclosed in the present disclosure as long as it does not affect the effect that the present disclosure may produce and the purpose that the present disclosure may achieve.

Figure 2:
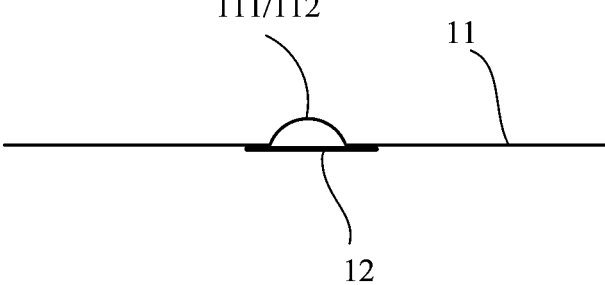
Figure 3:
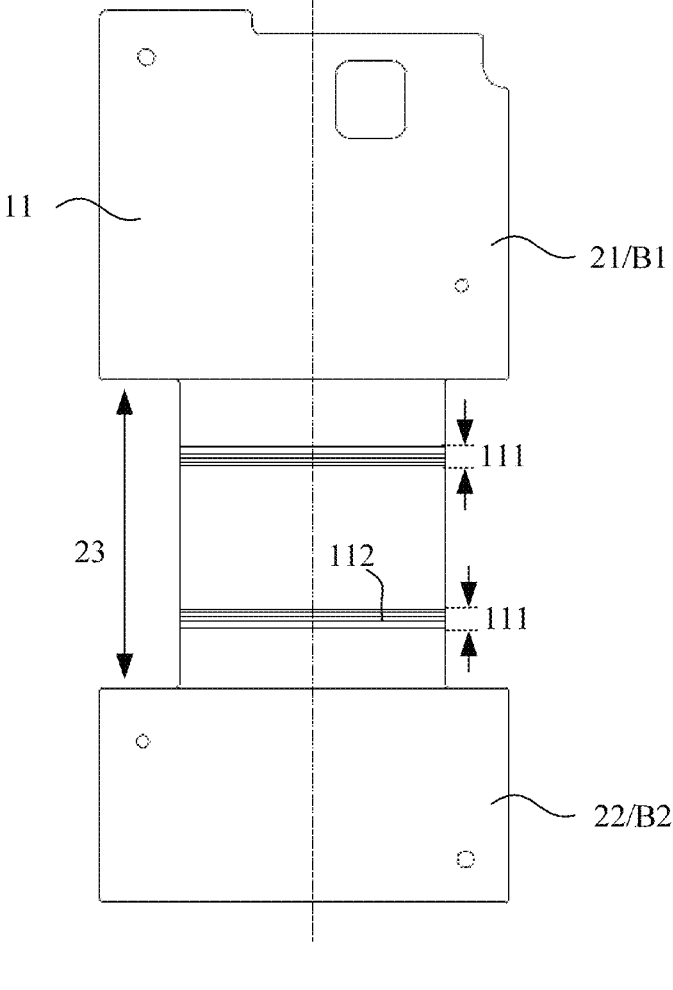
Figure 4:
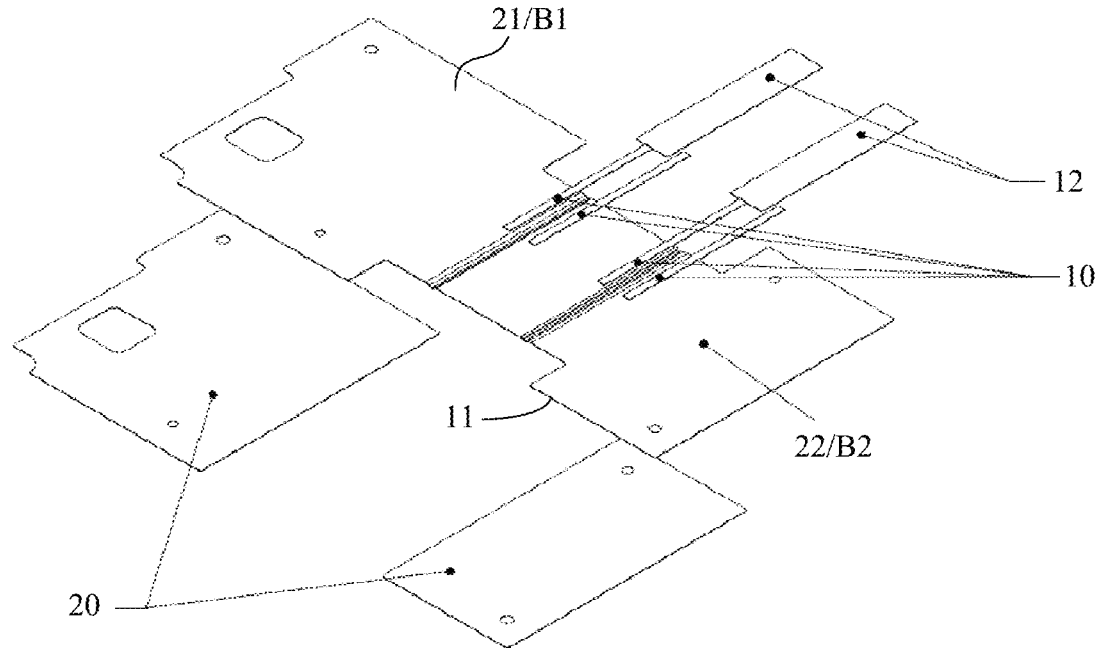
Figure 5:
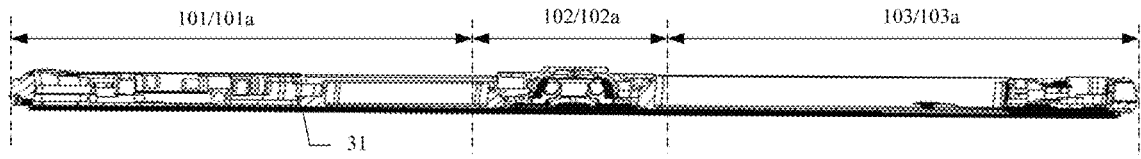
Figure 6:
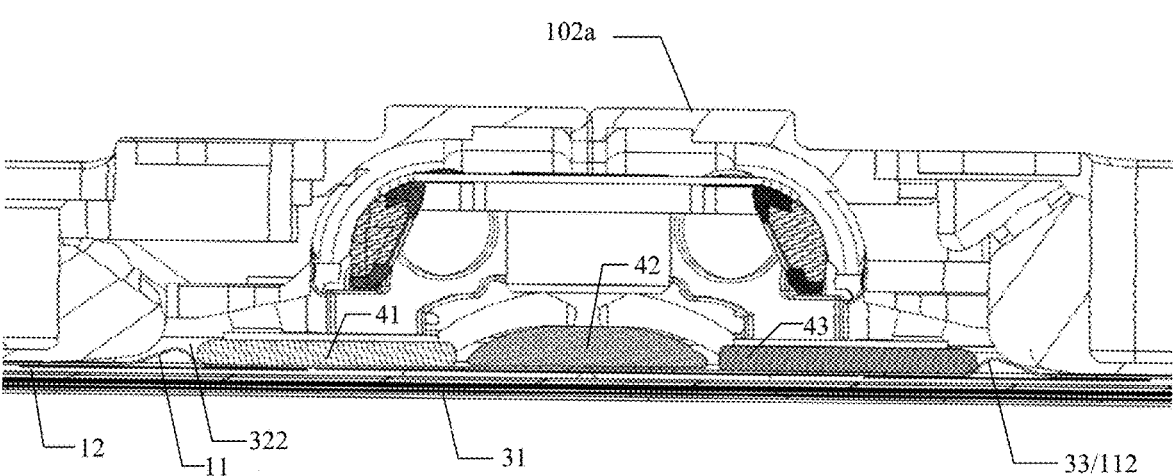
Figure 7:
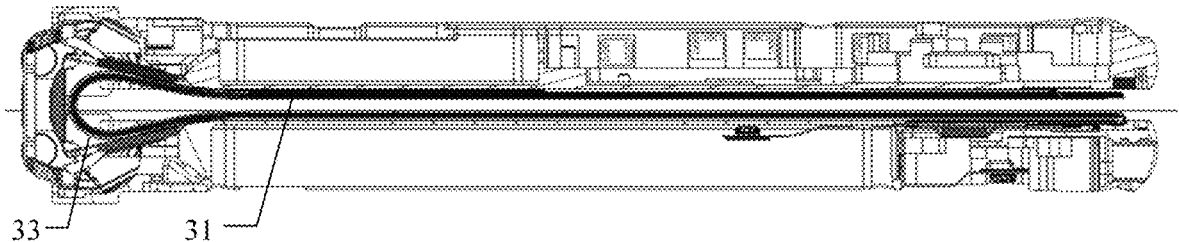
Figure 8:
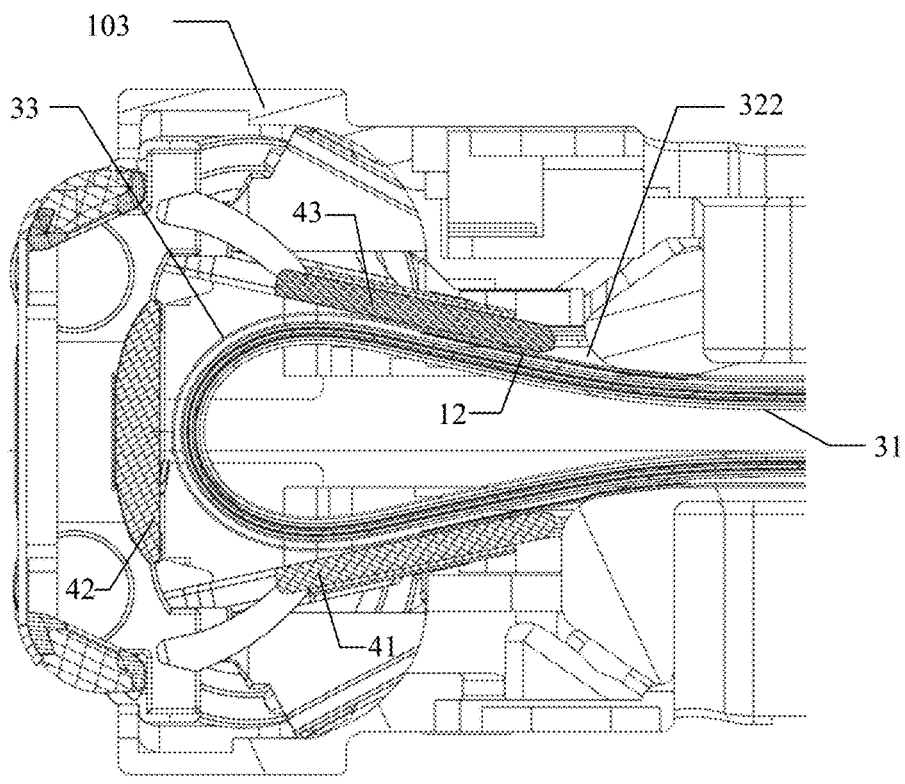

FIG. 1 is a top view of a thermal conductive element, according to an embodiment of the present disclosure;

FIG. 2 is a side view of the thermal conductive element shown in FIG. 1, according to an embodiment of the present disclosure;

FIG. 3 is a top view of another thermal conductive element, according to an embodiment of the present disclosure;

FIG. 4 is an exploded view of a thermal conductive element, according to an embodiment of the present disclosure;

FIG. 5 is a schematic structural diagram of an electronic device in an unfolded state, according to an embodiment of the present disclosure;

FIG. 6 is a partially enlarged view of FIG. 5 in a second area, according to an embodiment of the present disclosure;

FIG. 7 is a schematic structural diagram of an electronic device in a folded state, according to an embodiment of the present disclosure; and FIG. 8 is a partially enlarged view of FIG. 7 in a second area, according to an embodiment of the present disclosure.

DETAILED DESCRIPTION

The embodiments in the present disclosure will be clearly and thoroughly described hereinafter with reference to the accompanying drawings in the embodiments of the present disclosure. Apparently, the described embodiments are merely some but not all of the embodiments of the present disclosure. Based on the embodiments in the present disclosure, other embodiments derived by those of ordinary skill in the art without creative efforts still fall within the scope of protection of the present disclosure.

In order to make the above objects, features, and advantages of the present disclosure more obvious and understandable, the present disclosure will be described in further detail hereinafter in conjunction with the accompanying drawings and specific embodiments.

Referring to FIGS. 1 and 2, FIG. 1 is a top view of a thermal conductive element, according to an embodiment of the present disclosure, and FIG. 2 is a side view of the thermal conductive element shown in FIG. 1. The thermal conductive element includes a thermal conductive sheet 11 and a target piece 12, where the target piece is configured to be disposed in a target area of the thermal conductive sheet 11, and the target piece makes a target part 111 of the thermal conductive sheet 11 deform to form a first protrusion 112.

The thermal conductive element may be used in an electronic device to dissipate heat generated by the electronic device and to improve the heat dissipation rate of the electronic device. Further, the target piece 12 of the thermal conductive element causes the thermal conductive sheet 11 to form a first protrusion 112 in the target area. By a force applied by the target piece 12, the target area of the thermal conductive sheet 11 may be switched from an expansion state to a protrusion state to form the first protrusion 112, which is suitable for different application scenarios of the electronic device. The expansion here may mean providing a force to the target piece 12, which causes the thermal conductive sheet 11 to curve in the middle part to form a larger second protrusion, and the target part 111 where the first protrusion 112 is located expands to become a part of the formed second protrusion.

The thermal conductive element has two different postures. In the first posture, corresponding to the unfolded state of the electronic device, the target part 111 of the thermal conductive sheet 11 forms at least one first protrusion 112 under the action of the target piece 12. In the second posture, corresponding to the folded state of the electronic device, a force is applied to two sides of the middle part of the thermal conductive sheet 11 by the electronic device. The middle part of the thermal conductive sheet begins to curve with the electronic device, to form a second protrusion. The target part 111 is a portion of the middle part, and the middle part is larger than the target part 111.

The target piece 12 exerts a force onto the first protrusion 112, which causes the thermal conductive sheet 11 to form the first protrusion 112 on the target part 111. When the thermal conductive element is not subjected to an external force, the elastic contraction property of the target piece 12 causes the thermal conductive sheet 11 to form the first protrusion 112. The target part 111 of the thermal conductive sheet 11 does not have a strain, that is, the first protrusion 112 is curved without tensile deformation, and there will be no length difference between the two surfaces of the thermal conductive sheet 11.

The deformation capacity of the target piece 12 is stronger than the deformation capacity of the thermal conductive sheet 11, that is, the target piece 12 is more prone to elastic deformation relative to the thermal conductive sheet 11. The target piece 12 may be an elastic film. Thermal conductive sheet 11 may be a graphite film, a metal foil, etc.

Since the deformation capacity of the target piece 12 is stronger than the deformation capacity of the thermal conductive sheet 11, a target piece 12 in a stretched state may be attached and fixed to the target area of the thermal conductive sheet 12. The natural contraction of the target piece 12 acts on the target part 111 by applying an action force, which causes the first protrusion 112 to be formed on the target part 111.

As mentioned earlier, due to the elastic contraction of the target piece 12, the thermal conductive sheet 11 forms the first protrusion 112 on the target part 111. Accordingly, when the target piece 12 receives a reaction force that is greater than the action force provided by the target piece 12, the deformation of the target part 111 of the thermal conductive sheet 11 begins to recover. When the target piece 12 receives a reaction force that is smaller than the action force provided by the target piece 12, the deformation of the target part 111 of the thermal conductivity sheet 11 begins (or continues) to form the first protrusion 112. In this way, by controlling the target piece 12, the target part 111 of the thermal conductive sheet 11 may form the first protrusion 112 or expand, thereby achieving a switch of the thermal conductive element between different states.

The thermal conductive element is used in an electronic device. When the electronic device exerts a force through the target piece 12, the first protrusion 112 may expand (or unfold) or return to the first protrusion 112 state. In order to avoid excessive force acting on the electronic device and damaging the device, in the embodiments of the present disclosure, the maximum deformation elasticity of the target piece 12 is not greater than 1N. The thickness and material of the elastic film of the target piece 12 may be configured to set the range of the maximum deformation elasticity of the target piece 12.

FIG. 3 is a top view of another thermal conductive element, according to an embodiment of the present disclosure. Based on the above described embodiments, the thermal conductive sheet 11 shown in FIGS. 2 and 3 may further include: a first attaching area 21, where a first part B1 of the thermal conductive sheet 11 corresponds to the first attaching area 21; and a second attaching area 22, where a second part B2 of the thermal conductive sheet 11 corresponds to the second attaching area 22. A target area 23 is located between the first attaching area 21 and the second attaching area 22. The target part 111 is inside the middle part, and the middle part is a part between the first part B1 and the second part B2. The middle part is larger than the target part 111, and the target part 111 is a part of the middle part.

The middle part is deformed to form the second protrusion by the force from the first part B1 and the second part B2. The force applied to the middle part is a reaction force for the force provided by the target piece 12. As mentioned earlier, when the thermal conductive element is not subjected to external force, the target part 111 is affected by the contraction force of the target piece 12, which causes a formation of the first protrusion 112. When the electronic device is bent in a folded state, the target part 111 is affected by the reaction force exerted by the bending of the electronic device. The first part B1 and the second part B2 will exert a reaction force on the middle part, which then causes the middle part of the thermal conductive sheet to change into a second protrusion.

Through the first attaching area 21 and the second attaching area 22, the thermal conductive element may be fixed to two corresponding areas of a device body of the electronic device.

In the illustrated embodiment in FIG. 3, there are two target parts 111 arranged in parallel. Each of the two target parts 111 may form at least one first protrusion 112.

FIG. 4 is an exploded view of a thermal conductive element, according to an embodiment of the present disclosure. The thermal conductive sheet 11 is disposed with adhesive films 20 in the first attaching area 21 and the second attaching area 22 for bonding and fixing to the corresponding areas of the device body. Between the first part B1 and the second part B2 of the thermal conductive sheet 11 is the middle part, which has no adhesive film for bonding or fixing to the device body. The middle part may thus bend (or curve) as the electronic device folds, thereby forming the second protrusion.

Referring to FIGS. 2 and 4, the two opposite edges of the target piece 12 are bonded and fixed to the corresponding two sides of a target part through a pair of rubber strips 10, The contraction force of the target piece 12 may act on the thermal conductive sheet 11 through the bonding areas of the adhesive strips 10, so that a target part of the thermal conductive sheet 11 forms a first protrusion 112.

Based on the above described embodiments, embodiments of the present disclosure further provide an electronic device. The electronic device is shown in FIGS. 5-8.

Referring to FIGS. 5-8, FIG. 5 is a schematic structural diagram of an electronic device in an unfolded state, according to an embodiment of the present disclosure. FIG. 6 is a partially enlarged view of a second area of FIG. 5. FIG. 7 is a schematic structural diagram of an electronic device in a folded state, according to an embodiment of the present disclosure. FIG. 8 is a partially enlarged view of the second area of FIG. 7.

The electronic device has a first region 101, a second region 102, and a third region 103 arranged sequentially along a first direction. The first region 101 and the third region 103 may bend based on and/or with respect to the second region 102. The electronic device includes: a first device body 101*a*, a second device body 103*a*, and a hinge-connection element 102*a* located between the first device body 101*a* and the second device body 103*a*. The first device body 101*a* and the second device body 103*a* may bend (or fold) with respect to and/or based on the hinge-connection element 102*a*.

If the first device body 101*a* and the second device body 103*a* connected through the hinge-connection element 102*a* are in the unfolded state, the deformed portion of the thermal conductive element 33 of the electronic device forms at least one first protrusion 112.

If the first device body 101*a* and the second device body 103*a* connected through the hinge-connection element 102*a* are in a folded state, the deformed portion of the thermal conductive element 33 forms a second protrusion.

In the unfolded state, the deformed portion is the target part 111 of the thermal conductive sheet 11 in the thermal conductive element 33. In the folded state, the deformed portion is the middle part of the thermal conductive sheet 11. The thermal conductive element 33 extends from the first device body 101*a* to the second device body 103*a*, and may conduct heat from the first device body 101*a* to the second device body 103*a*. As described earlier, the thermal conductive element 33 includes a thermal conductive sheet 11 and a target piece 12. In the unfolded state, the target piece 12 is configured to be disposed in the target area of the thermal conductive sheet 11, so that the target part 111 of the thermal conductive sheet 11 is deformed to form the first protrusion 112.

In the unfolded state, the first device body 101*a* and the second device body 103*a* assure a coplanar condition, including that the first device body 101*a* and the second device body 103*a* are coplanar or approximately coplanar. In the folded state, the first device body 101*a* and the second device body 103*a* assure a parallel condition, including that the first device body 101*a* and the second device body 103*a* are parallel or approximately parallel to each other.

When the electronic device switches from the unfolded state to the folded state, the at least one first protrusion 112 expands to become a part of the second protrusion. Specifically, the hinge-connection element 102*a* may exert a force on the thermal conductive element 33 when the electronic device is switched from the unfolded state to the folded state. This force may cause the target piece 12 to follow the relative bending of the first device body 101*a* and the second device body and get stretched and then begin to curve. The first protrusion 112 then expands, thereby becoming a part of the second protrusion formed by the deformation of the middle part of the thermal conductive sheet 11.

Optionally, the electronic device is a foldable display device with a flexible display screen 31, which is fixed on a metal middle frame. The side of the metal middle frame facing away from the flexible display screen 31 has a circuit motherboard and battery assembly. The circuit mainboard may be disposed in the first device body 101*a*, while the battery assembly may be disposed in the second device body 103*a*. The thermal conductive sheet 11 includes a first part, a second part, and a middle part, which are integrated into a single unit. The middle part is between the first part and the second part. The thermal conductive sheet 11 is fixed onto the side surface of the metal middle frame facing away from the flexible display screen 31, with the first part located between the metal middle frame and the circuit mainboard, and the second part located between the metal middle frame and the battery assembly.

As shown in FIGS. 4 and 5, the first part of the thermal conductive sheet 11 may be bonded and fixed to the metal middle frame located in the first device body 101 through a piece of glue film 20, and the second part of the thermal conductive sheet 11 may be bonded and fixed to the metal middle frame located in the second device body 103 through another piece of glue film 20.

In the disclosed embodiments, the electronic device uses the thermal conductive element 33 to conduct the heat generated by the first device body 101*a* to the second device body 103*a*, speeding up the heat transfer from the high-temperature first device body 101*a* to the low-temperature second device body 103*a*, thereby achieving an even temperature of the entire device. Generally, the circuit motherboard includes a processor, and the technical solutions of the present disclosure may speed up the heat dissipation speed of the processor on the circuit motherboard located in the first device body 101*a*.

As shown in FIGS. 5 and 6, the at least one first protrusion 112 is located in a first space 322 formed by the electronic device when the electronic device is in the unfolded state. As shown in FIGS. 7 and 8, the second protrusion is located in a second space formed by the electronic device when the electronic device is in the folded state.

In the embodiments disclosed herein, the electronic device uses the thermal conductive element 33 described earlier. In the unfolded state, as shown in FIG. 6, the thermal conductive sheet 11 may form a protrusion 112 based on the contraction of target piece 12 itself. The protrusion 112 may be accommodated in the first space 322. In the unfolded state, as shown in FIG. 8, the thermal conductive sheet 11 may curve as the hinge-connection element 102*a* bends. During the bending process, as the hinge-connection element 102*a* bends, the target piece 12 is stretched, that is, the target piece 12 is subjected to a reaction force that is greater than the force provided to the thermal conductive sheet 11. Accordingly, the first protrusion 112 expands or unfolds, and the deformation of the target part of the thermal conductive sheet 11 begins to recover. The middle part of the thermal conductive sheet 11 may further curve as the electronic device bends, to form a second protrusion, which is accommodated in the second space. In this process, the middle part of the thermal conductive sheet 11 may form a smooth curved surface that matches the flexible display screen 31.

When the electronic device is in the unfolded state (as shown in FIGS. 5 and 6), the first device body 101*a* and the second device body 103*a* are in a coplanar state or an approximately coplanar state. When the electronic device is in the folded state (as shown in FIGS. 7 and 8), the first device body 101*a* and the second device body 103*a* are closed and parallel with each other or approximately parallel with each other. The electronic device may also include an intermediate state between the unfolded state and the folded state. In the intermediate state, the first device body 101*a* and the second device body 103*a* have an included angle greater than 0° and less than 180°.

The flexible display screen 31 includes a first partial screen body located on the first device body 101*a*, a second partial screen body located on the second device body 103*a*, and a middle partial screen body located between the first partial screen body and the second partial screen body. The hinge-connection element 102*a* includes a first workpiece 41, a second workpiece 42, and a third workpiece 43. The first workpiece 41 and the third workpiece 43 are respectively arranged on two opposite sides of the second workpiece 42. Both the first workpiece 41 and the third workpiece 43 may rotate relative to the second workpiece 42, so as to adapt to a switch posture of the electronic device between the unfolded state and the folded state.

When the electronic device is in the unfolded state, the first space 322 may be formed by gaps between different structural components of the hinge-connection element 102a. When the electronic device is in the folded state, a second space is formed by the first workpiece 41, the second workpiece 42, and the third workpiece 43.

When the electronic device is in the unfolded state, the first workpiece 41, the second workpiece 42, and the third workpiece 43 are coplanar or approximately coplanar, so that the middle partial screen body of the flexible display screen 31 corresponding to the hinge-connection element 102a may be coplanar or approximately coplanar with the first partial screen body and the second partial screen body.

When the electronic device switches from the unfolded state to the folded state, in the folded state, the first workpiece 41, the second workpiece 42, and the third workpiece 43 may form a second space for accommodating the middle partial screen body in the folded state, that is, to accommodate a protrusion structure formed by the middle partial screen body. At the same time, the formed second place may also accommodate the second protrusion formed by the middle part of the thermal conductive sheet 11 that matches the middle partial screen body. The size and shape of the second space are controlled through the mechanical structures of the three workpieces. The larger the second space, the smaller the deformation degree of the middle partial screen body, and the smaller the creases of the flexible display screen 31. On the contrary, the smaller the second space is, the greater the deformation degree of the middle partial screen body, and the greater the creases of the flexible display screen 31.

When the electronic device switches from the unfolded state to the folded state, the first workpiece 41 and the third workpiece 43 may respectively provide forces to the edges of the corresponding first protrusions 112, so that the target piece 12 gets stretched by following the bending of the electronic device, thereby expanding the first protrusion 112. The target part 111 of the thermal conductive sheet 11 begins to curve as the flexible display screen 31 bends, thereby forming a curved surface that matches the curved surface of the middle partial screen body of the flexible display screen 31. When the electronic device switches from the folded state to the unfolded state, the force exerted by the first workpiece 41 and the third workpiece 43 on the thermal conductive sheet 11 gradually decreases, and the contraction force applied to the middle part of the thermal conductive sheet 11 by the target piece 12 gradually increases, so that the target part 111 is pushed by the contraction force of the target piece 12 to form a first protrusion 112, which is accommodated in the first space 322.

In the embodiments of the present disclosure, the first protrusion 112 of the thermal conductive element 33 is formed by the force provided by the target piece 12 located in the target area. As mentioned earlier, in the unfolded state, when the thermal conductive element 33 is not subjected to external force, the natural contraction force of the target piece 12 causes the target area of the thermal conductive sheet 11 to deform to form a first protrusion 112.

The deformed portion of the thermal conductive sheet 11 may be deformed into a second protrusion by a force exerted by the first device body 101a and the second device body 103a. The force applied to the deformed portion is the reaction force for the force provided by the target piece 12. As mentioned earlier, when the electronic device switches from the unfolded state to the folded state, as the first device body 101a and the second device body 103a are bent and deformed, the deformation exerts a reaction force to the thermal conductive sheet 11, which is greater than the force applied to the target area by the target piece 12. This causes the target area to deform as the thermal conductive sheet 11 bends and curves, thereby causing the first protrusion 112 to expand and curve. This makes the target area become a part of the second protrusion formed by the middle part.

The thermal conductive sheet 11 is made of a material with good thermal conductivity, such as graphite film, metal foil, and the like. Although graphite film or metal foil has good thermal conductivity, its elastic tensile properties are poor and it is easy to bend and break. In conventional designs, with respect to bendable electronic devices, it is generally necessary to segment the graphite film or metal foil and separate segments in the bendable area of the electronic device to avoid breakage caused by the bending of the electronic device. This then affects the heat dissipation performance of the electronic device in the bending area. In the embodiments of the present disclosure, due to the buffering effect of the first protrusion 112, the first device body 101a, the hinge-connection element 102a, and the second device body 103a of the electronic device may use an integral thermal conductive sheet 11. This allows the thermal conductive sheet 11 with poor deformation capacity to be not subject to tensile deformation during the switching process of the electronic device between the folded state and the folded state. This then prevents the thermal conductive sheet 11 from being stretched and broken, and prevents the heat dissipation structure of the electronic device from being damaged when the electronic device is bent and deformed, thereby ensuring the heat dissipation performance of the electronic device.

In the embodiments of the present disclosure, electronic devices include mobile phones, tablet computers, wearable devices, etc. The embodiments of the present disclosure do not limit the specific implementation of the corresponding electronic devices.

In some embodiments, a thermal conductive sheet 11 is configured to have two target areas, each of which forms a first protrusion 112 by a respective target piece 12. The electronic device has respective first spaces formed at positions corresponding to the two target areas for accommodating the corresponding first protrusions 112 in the unfolded state.

The two first protrusions 112 are arranged symmetrically left and right, so that during the folding and unfolding process of the electronic device, the deformation of the thermal conductive sheet 11 and the recovery of the protrusions may be symmetrically processed on both sides.

The thermal conductive sheet 11 has a first attaching area located on the first device body 101a and a second attaching area located on the second device body 103a. The first attaching area and the second attaching area are respectively attached and fixed to the device body through thermally conductive glue. By including the first attaching area and the second attaching area that are respectively attached and fixed to the device body through thermal conductive glue, it allows the achievement of a large-area thermal contact of the first part and the second part of the thermal conductive sheet 11 with the corresponding areas of the device body. This facilitates heat generated by the operation of the device body being quickly transferred to the thermal conductive sheet 11.

The middle part of the thermal conductive sheet 11 between the first part and the second part is in direct contact with the device body, and there is no glue layer. The middle part of the thermal conductive sheet and the main body may be in a detached state, which facilitates the protruding and expanding of the first protrusion 112 in the thermal conductive sheet 11 during the folding and unfolding processes of the electronic device.

As mentioned earlier, the thermal conductive sheet 11 includes a first attaching area located on the first device body 101*a* and a second attaching area located on the second device body 103*a*. The first part of the thermal conductive sheet 11 corresponds to the first attaching area and the second part of the thermal conductive sheet 11 corresponds to the second attaching area. The target area is located between the first attaching area and the second attaching area, and is inside the middle part, where the middle part is a part between the first part and the second part. In the unfolded state, a portion (i.e., target part 111) of the middle part is deformed to form a first protrusion 112 due to the force exerted by the target piece 12. In the folded state, the middle part of the device body is deformed to form a second protrusion by the second force exerted by the first part and the second part. When the electronic device switches between the unfolded state and the folded state, the force applied to the thermal conductive sheet 11 is different, which in turn causes the force received by the target piece 12 to be different. This allows the achievement of adjusting the force applied to the target area by the target piece 12, so that the first protrusion 112 can expand or return to the protrusion state.

Embodiments in this specification are described in a progressive manner, a parallel manner, or a combination thereof. Each embodiment focuses on its difference from other embodiments. The same and similar parts among the various embodiments are mutually inclusive and can refer to each other.

It should be noted that in the description of the present disclosure, the descriptions of the drawings and embodiments are illustrative rather than restrictive. The same drawing reference numerals identify the same structures throughout the description of the embodiments. In addition, the drawings may exaggerate the thickness of some layers, films, panels, areas, etc., for purposes of understanding and ease of description. It should be noted that when an element such as a layer, film, region, or substrate is referred to as being "on" another element, it may be directly on the other element or intervening elements may be present. In addition, "on" refers to positioning an element on or below another element, but does not essentially mean positioning on the upper side of another element according to the direction of gravity.

The orientation or positional relationship indicated by the terms "upper," "lower," "top," "bottom," "inner," "outer," etc., are based on the orientation or positional relationship shown in the drawings, and are merely for the convenience and simplified description of the present disclosure, rather than indicating or implying that the device or element referred to must have a specific orientation, be constructed and operated in a specific orientation, and therefore cannot be construed as a limitation on the present disclosure. When a component is said to be "connected" to another component, it may be directly connected to the other component or there may be an intermediate component present at the same time.

It should also be noted that in the present disclosure, sequential terms such as first and second are merely used to distinguish one entity or operation from another entity or operation, and do not necessarily require or imply that these entities or operations must have such actual relationship or sequence between them. Furthermore, the terms "comprises," "comprises," or any other variation thereof are intended to cover a non-exclusive inclusion, such that an article or device including a list of elements includes not only those elements, but also other elements not expressly listed, or it also includes elements inherent to the element or equipment. Without further limitation, an element defined by the statement "comprises a . . . " does not exclude the presence of other identical elements in an article or device that includes the aforementioned element.

The above description of the disclosed embodiments enables those skilled in the art to implement or use the present disclosure. Various modifications to these embodiments will be readily available to those skilled in the art, and the generic principles defined herein may be practiced in other embodiments without departing from the spirit or scope of the present disclosure. Accordingly, the present disclosure is not limited to the embodiments shown herein but is to be accorded the widest scope consistent with the principles and novel features disclosed herein.

What is claimed is:

1. An electronic device, comprising:
   a first device body;
   a second device body; and
   a hinge-connection element located between the first device body and the second device body and including a first workpiece, a second workpiece, and a third workpiece, the first workpiece and the third workpiece respectively arranged on two opposite sides of the second workpiece and configured to rotate relative to the second workpiece, so as to adapt to a switch posture of the electronic device between the unfolded state and the folded state, wherein:
   when the first device body and the second device body connected through the hinge-connection element are in the unfolded state, a deformed portion of a thermal conductive element of the electronic device forms at least one first protrusion; and
   when the first device body and the second device body connected through the hinge-connection element are in the folded state in which the first device body and the second device body are parallel to each other, the deformed portion of the thermal conductive element forms a second protrusion.

2. The electronic device of claim 1, wherein, when the electronic device switches from the unfolded state to the folded state, the at least one first protrusion recovers to become a part of the second protrusion.

3. The electronic device of claim 1, wherein the at least one first protrusion is accommodated in a first space formed by the electronic device when the electronic device is in the unfolded state; and
   the second protrusion is accommodated in a second space formed by the electronic device when the electronic device is in the folded state.

4. The electronic device of claim 1, wherein the at least one first protrusion of the thermal conductive element is formed by a force provided by a target piece located in a target area.

5. The electronic device of claim 4, wherein;
   the deformed portion is recovered to form the second protrusion by a force of the first device body and the second device body, and the force applied to the deformed portion is a reaction force for the force provided by the target piece; and/or the at least one first protrusion includes two first protrusions symmetrically arranged on left and right sides of the target area.

6. The electronic device of claim 2, wherein the electronic device includes a flexible display screen.

7. The electronic device of claim 6, wherein, when the at least one first protrusion recovers to become a part of the second protrusion, a middle part of the thermal conductive sheet forms a smooth curved surface that matches the flexible display screen.

8. A thermal conductive element, comprising:

a thermal conductive sheet; and a target piece, wherein the target piece is configured to be disposed in a target area of the thermal conductive sheet by fixing the target piece in a stretched state to the target area of the thermal conductive sheet through a pair of rubber strips, and the target piece makes a target part of the thermal conductive sheet deform to form a first protrusion.

9. The thermal conductive element of claim 8, wherein the first protrusion is acted upon by a force from the target piece.

10. The thermal conductive element of claim 9, wherein, when the target piece is subjected to a reaction force greater than an action force provided by the target piece, the deformation of the target part of the thermal conductive sheet begins to recover; and when the target piece is subjected to a reaction force smaller than an action force provided by the target piece, the deformation of the target part of the thermal conductive sheet begins to form the first protrusion.

11. The thermal conductive element of claim 10, wherein the thermal conductive sheet further comprises:

a first attaching area, a first part of the thermal conductive sheet corresponding to the first attaching area; and a second attaching area, a second part of the thermal conductive sheet corresponding to the second attaching area, wherein:

the target area is located between the first attaching area and the second attaching area, and the target part is inside a middle part, which is a part between the first part and the second part and is larger than the target part; and the middle part is deformed to form a second protrusion by a force exerted by the first part and the second part, and a force received by the middle part serves as a reaction force for the action force provided by the target piece.

12. The thermal conductive element of claim 11, wherein each of the first attaching area and the second attaching area is disposed with a respective film for bonding to a corresponding area of a device body of an electronic device.

13. The thermal conductive element of claim 8, wherein: the target piece is an elastic film; and/or the thermal conductive sheet is one of a graphite film or a metal foil.

14. The thermal conductive element of claim 8, wherein the target piece makes the target part of the thermal conductive sheet deform to form more than one first protrusion.

15. The thermal conductive element according to claim 8, wherein the target piece and the thermal conductive sheet are different materials.

16. An electronic device, comprising:

a flexible display screen;

a first device body;

a second device body; and a hinge-connection element located between the first device body and the second device body, wherein:

when the first device body and the second device body connected through the hinge-connection element are in an unfolded state, a deformed portion of a thermal conductive element of the electronic device forms at least one first protrusion;

when the first device body and the second device body connected through the hinge-connection element are in a folded state in which the first device body and the second device body are parallel to each other, the deformed portion of the thermal conductive element forms a second protrusion; and when the at least one first protrusion recovers to become a part of the second protrusion, a middle part of the thermal conductive sheet forms a smooth curved surface that matches the flexible display screen.

* * * * *